United States Patent [19]
Yoon et al.

[11] Patent Number: 6,100,744
[45] Date of Patent: Aug. 8, 2000

[54] INTEGRATED CIRCUIT DEVICES HAVING IMPROVED INTERNAL VOLTAGE GENERATORS WHICH REDUCE TIMING SKEW IN BUFFER CIRCUITS THEREIN

[75] Inventors: Sei-Seung Yoon; Seong-Min Wi, both of Seoul, Rep. of Korea

[73] Assignee: Samsung Electronics Co., Ltd., Rep. of Korea

[21] Appl. No.: 09/148,717

[22] Filed: Sep. 4, 1998

[30] Foreign Application Priority Data

Sep. 4, 1997 [KR] Rep. of Korea ............... 97-45862

[51] Int. Cl.$^7$ .................................................. H03K 17/16
[52] U.S. Cl. ........................................ 327/390; 327/589
[58] Field of Search .............................. 327/589, 538, 327/540, 390, 108, 112; 363/60

[56] References Cited

U.S. PATENT DOCUMENTS

| | | | |
|---|---|---|---|
| 5,241,502 | 8/1993 | Lee et al. ............................ | 365/203 |
| 5,535,171 | 7/1996 | Kim et al. ........................... | 365/233 |
| 5,594,380 | 1/1997 | Nam .................................... | 327/390 |
| 5,680,071 | 10/1997 | Senoh et al. ........................ | 327/589 |
| 5,773,999 | 6/1998 | Park et al. .......................... | 327/108 |
| 5,828,262 | 10/1998 | Rees .................................... | 327/390 |

*Primary Examiner*—Jung Ho Kim
*Attorney, Agent, or Firm*—Myers Bigel Sibley & Sajovec

[57] ABSTRACT

Integrated buffer circuits include an output driver powered at a first power supply voltage (EVC) and a voltage boosting circuit which drives an input (DOK) of the output driver and is powered at a second power supply voltage (VINTQ) having a magnitude less than a magnitude of the first power supply voltage. An internal power supply voltage generator is provided which generates the second power supply voltage at a level which varies inversely with increases in the first power supply voltage in order to minimize timing skew associated with the output driver. This is achieved by lowering the voltage of the signal applied to the input (DOK) of the output driver to compensate for the output driver being powered at an increased first power supply voltage.

24 Claims, 7 Drawing Sheets

INTEGRATED CIRCUIT DEVICES HAVING IMPROVED INTERNAL VOLTAGE GENERATORS WHICH REDUCE TIMING SKEW IN BUFFER CIRCUITS THEREIN

FIELD OF THE INVENTION

The present invention relates to integrated circuit devices, and more particularly to integrated circuit devices having buffer circuits therein.

BACKGROUND OF THE INVENTION

Semiconductor memory devices such as DRAMs and SRAMs are making significant gains in data output speed and bandwidth and their integration density is increasing. The timing gap between the output data hold time (tOH) and the clock to valid output delay time (tSAC) is an important parameter in synchronous memories because of the importance of the burst access mode of operation. This is because the clock cycle time (tCC) depends on the timing gap. The clock cycle time is the sum of tOH, tSAC, and the timing gap between tOH and tSAC. The tOH and tSAC are determined by the rising and falling transition times, respectively. Accordingly, if the timing gap increases, the clock cycle time will increase and the bandwidth will decrease. Increases in the timing gap between tOH and tSAC may be caused by variations in power supply voltage and temperature, or by impedance mismatch between data output pins.

To inhibit increases in the timing gap between tOH and tSAC due to power supply voltage variations, a data output buffer may be supplied with a stable internal power supply voltage and an external power supply. For example, a conventional data output buffer may include a pull-up MOS transistor having its current path electrically coupled in series between an external power supply voltage and a data output pad and a pull-down transistor having its current path electrically coupled in series between the data output pad and a reference power supply voltage (such as ground voltage). In order to gain speed, the gate electrode of the pull-up MOS transistor may be supplied with a boosted voltage which is determined by the internal power supply voltage.

However, if a higher external power supply voltage is applied to semiconductor memory device with the above-described data output buffer arrangement, the source-drain voltage of the pull-up MOS transistor may increase and this increase may cause additional skew between the output high voltage (VOH) and the output low voltage (VOL) since the current driving capability of the pull-up MOS transistor is increased. When this occurs, the rising transition time becomes shorter while the falling transition time remains unchanged. Thus, the bandwidth of the memory device may be reduced because tOH becomes shorter and tSAC becomes longer.

SUMMARY OF THE INVENTION

It is therefore an object of the present invention to provide improved integrated buffer circuits.

It is another object of the present invention to provide integrated buffer circuits which can be powered by internal and external supply voltages.

It is still another object of the present invention to provide integrated buffer circuits which are less susceptible to variations in power supply voltages and enable high bandwidth operation.

These and other objects, advantages and features of the present invention are provided by integrated buffer circuits which comprise an output driver powered at a first power supply voltage (EVC) and a voltage boosting circuit which drives an input (DOK) of the output driver and is powered at a second power supply voltage (VINTQ) having a magnitude less than a magnitude of the first power supply voltage. In addition, a preferred internal power supply voltage generator is provided which generates the second power supply voltage at a level which varies inversely with increases in the first power supply voltage in order to minimize timing skew associated with the output driver. This is achieved by lowering the voltage of an input signal provided to the output driver (by the voltage boosting circuit) to compensate for the output driver being powered at an increased first power supply voltage.

In particular, the preferred internal power supply voltage generator comprises a first voltage generator which is electrically coupled to a first power supply line and generates a first reference voltage (VREF) having a magnitude less than the first power supply voltage (EVC) at an output thereof. A second voltage generator is also provided. The second voltage generator is electrically coupled to the output of the first voltage generator and the first power supply line and generates a second reference voltage (VREFQ) which varies inversely with increases in the first power supply voltage (EVC) above a threshold power supply voltage.

In addition, a third voltage generator is provided. This third voltage generator is electrically coupled to the output of second voltage generator and the first power supply line and generates the second power supply voltage (VINTQ) at a level which varies directly with changes in the second reference voltage (VREFQ).

The first voltage generator is configured so that the magnitude of the first reference voltage (VREF) is not significantly influenced by changes in the first power supply voltage when the first power supply voltage is greater than the second power supply voltage. The second voltage generator may comprise a first differential amplifier having a first input electrically connected to the output of the first voltage generator (VREF), a first pull-up driver having an input electrically coupled to an output of the first differential amplifier and an output electrically coupled to the output of the second voltage generator and a voltage divider having an input electrically connected to the output of the second voltage generator (VREFQ) and an output (Vdiv) electrically coupled to a second input of the first differential amplifier. The third voltage generator (buffer power supply) may also comprise a second differential amplifier having a first input electrically connected to the output of the second voltage generator (VREFQ) and a second pull-up driver having an input electrically coupled to an output of the second differential amplifier. The output of the second pull-up driver is also electrically connected to a second input of the second differential amplifier and the second power supply line (VINTQ).

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may referred to by the same reference symbols. In addition, references to logic gates which perform boolean functions are intended to include alternative logic gates and circuits which can be constructed to perform the same boolean functions.

Figure 1:
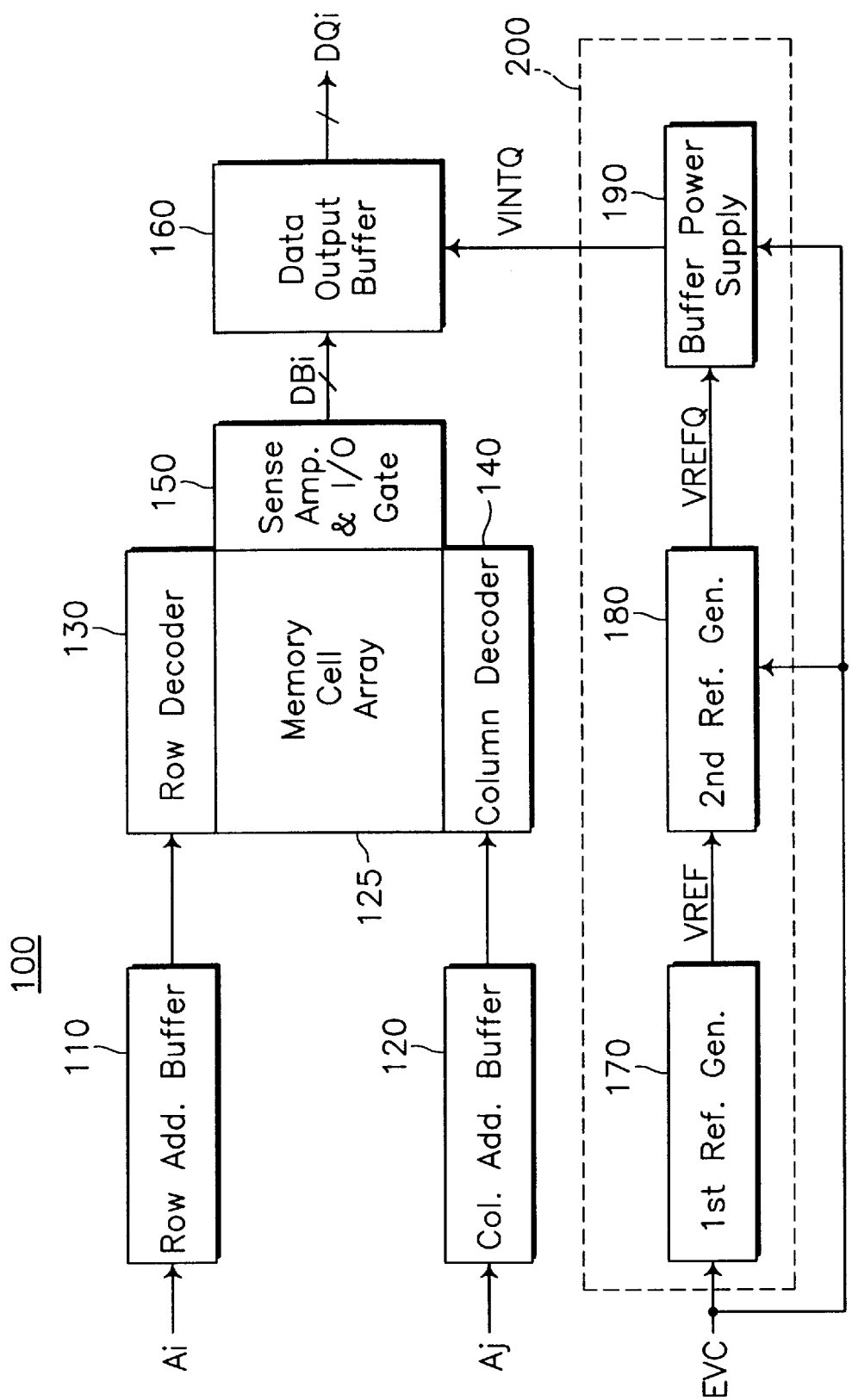
FIG. 1 diagram of an integrated circuit memory device according to an embodiment of the present invention.

Referring now to FIG. 1, a preferred embodiment of an integrated circuit semiconductor memory device according to the present invention is shown in block diagram form. The memory device 100 includes a row address buffer circuit 110 for receiving a row address Ai, a column address buffer circuit 120 for receiving a column address Aj, a memory cell array 125 having a plurality of memory cells therein (not shown) arranged in rows and columns, a row decoder circuit 130 for selecting a row of the memory cell array 125 on the basis of the row address Ai, a column decoder circuit 140 for selecting at least one column of the memory cell array 125, a sense amplifier and input/output (I/O) gate circuit 150 for sensing and amplifying data DBi from the selected memory cell(s), and a data output buffer circuit 160 for outputting the data DBi to I/O pad(s) DQi. The memory device 100 also includes an internal power supply voltage generator circuit 200 for generating an internal power supply voltage VINTQ based on an external power supply voltage EVC. The internal power supply voltage VINTQ and the external power supply voltage EVC are provided to the data output buffer 160.

The internal power supply voltage generator 200 includes a first reference voltage generator 170 which generates a first reference voltage VREF, a second reference voltage generator 180 which generates a second reference voltage VREFQ, and a third reference voltage generator (buffer power supply) 190 which generates the internal power supply voltage VINTQ as a buffer power supply voltage. The first and second reference voltage generators 170 and 180 and the buffer power supply voltage generator 190 are supplied with the external power supply voltage EVC.

Figure 2:
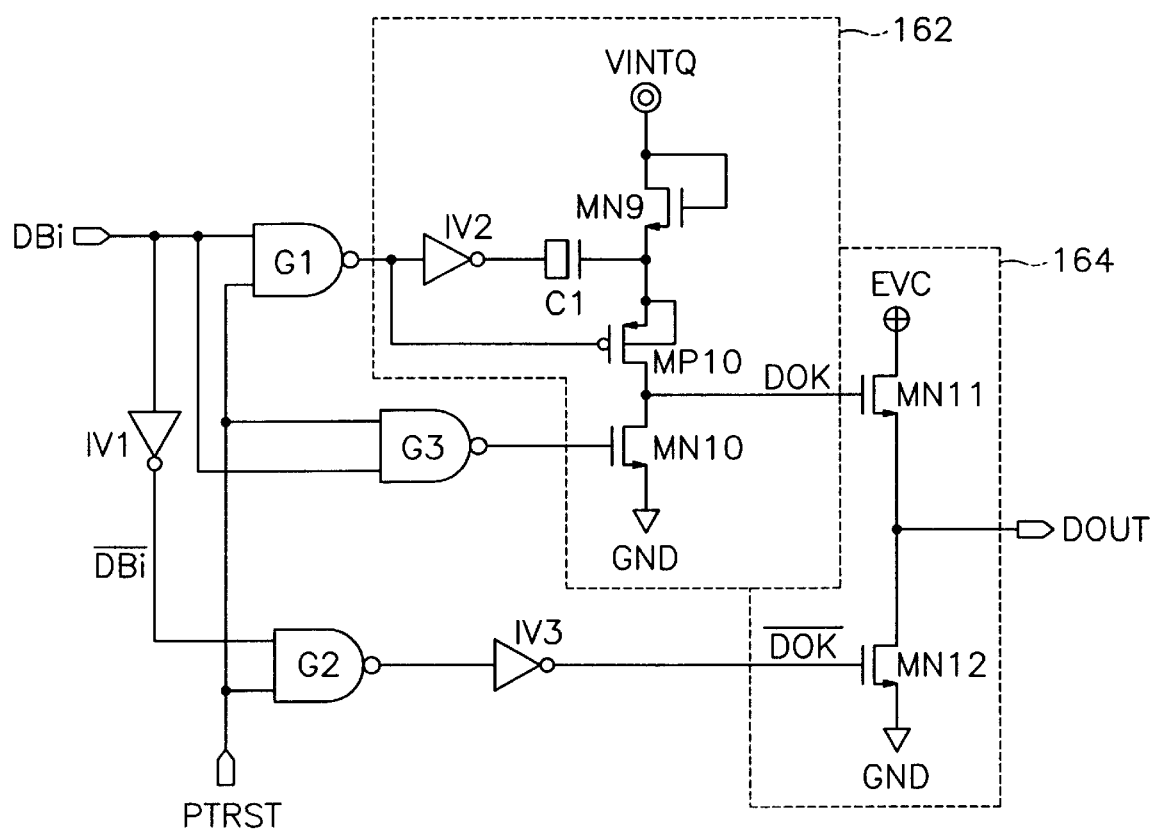
FIG. 2 is an electrical schematic of the data output buffer of FIG. 1.

FIG. 2 illustrates a detailed circuit schematic of the data output buffer 160 of FIG. 1. The data output buffer 160 comprises NAND gates G1, G2 and G3, first and third inverters IV1 and IV3, a boosting circuit 162, and a output driving circuit 164. A first NAND gate G1 has a first input for receiving a data signal DBi from the sense amplifier and I/O gate circuit 150 and a second input for receiving a control signal PTRST from an internal control circuit (not shown). The first inverter IV1 has an input for receiving the data signal DBi and an output for providing an inverted data signal $\overline{DBi}$. A second NAND gate G2 has a first input for receiving the inverted data signal $\overline{DBi}$ and a second input for receiving the control signal PTRST. A third NAND gate G3 has a first input for receiving the data signal DBi and a second input for receiving the control signal PTRST. The third inverter IV3 has an input electrically coupled to the output of the second NAND gate G2 and an output electrically coupled to the output driving circuit 164 on the second drive input ($\overline{DOK}$).

The boosting circuit 162 includes a second inverter IV2 having an input electrically coupled to the output of the first NAND gate G1, a charge pump capacitor C1 having a first electrode electrically coupled to an output of the second inverter IV2 and a second electrode which is electrically coupled to the internal power supply voltage VINTQ via a diode-connected NMOS transistor MN9. The boosting circuit 162 also includes a pull-up PMOS transistor MP10 having a source commonly coupled to both the second electrode of the capacitor C1 and the diode-connected transistor MN9, a drain electrically coupled to the first drive input (DOK) of the output driving circuit 164, and a gate electrode electrically coupled to the output of the first NAND gate G1. In addition, a pull-down NMOS transistor MN10 is provided having a drain electrically coupled to the drain of the pull-up transistor MP10, a source electrically coupled to a reference or lower power supply voltage (e.g., ground voltage GND), and a gate electrically coupled to the output of the third NAND gate G3. The pull-down NMOS transistor MN10 may also be electrically coupled to the output of the first NAND gate G1, in the event the third NAND gate G3 is not provided.

The output driving circuit 164 includes a pull-up NMOS transistor MN11 having a drain electrically coupled to an external power supply voltage EVC, a source electrically coupled to an output signal line DOUT and a gate electrically coupled to the drains of the transistors MP10 and MN10 within the boosting circuit 162 (i.e., first drive input DOK). The output driving circuit also includes a pull-down NMOS transistor MN12 having a drain electrically coupled to the output pad DOUT, a source electrically coupled to the reference power supply voltage GND, and a gate electrode electrically coupled to the output of the third inverter IV3 (i.e., second drive input $\overline{DOK}$).

Operation of the preferred data output buffer 160 will now be described in detail. When the data signal DBi is at a logic high level (and the inverted data signal $\overline{DBi}$ is at a logic low level) and the control signal PTRST is at a logic high level, the outputs of the first and third NAND gates G1, and G3 go to a logic low level while the output of the second NAND gate G2 goes to a logic high level. In the boosting circuit 162, the pull-up transistor MP10 turns on and the pull-down transistor MN1O turns off. As a result, the charge pump capacitor C1 supplies a predetermined boosted voltage (e.g., about VINTQ×1.8 volts) through the first pull-up transistor MP10 to the first drive input DOK (i.e., the gate of the pull-up transistor MN11 within the output driving circuit 164). The boosted voltage at the first drive input is provided to increase operating speed and depends on the magnitude of the internal power supply voltage VINTQ. Based on the output of the second NAND gate G2, a logic low level is supplied to the second drive input $\overline{DOK}$ (i.e., the gate of the pull-down transistor MN12 within the output driving circuit 164) so that the pull-down transistor MN12 turns off. Because the voltage level at the first drive input DOK is approximately equal to the sum of the pumping potential generated by the charge pump capacitor C1 and the potential passing the inverter IV2, the second pull-up transistor MN11 turns on and the voltage level on the output signal line DOUT goes to a logic high level.

On the other hand, when the data signal DBi is at a logic low level and the control signal PTRST is at a logic high level, the outputs of the first and third NAND gates G1, and G3 go to a logic high level while the output of the second NAND gate G2 goes to a logic low level. Accordingly, the pull-up transistor MP10 turns off, the pull-down transistor MN10 turns on, the pull-up transistor MN11 turns off, and the pull-down transistor MN12 turns on. Accordingly, the voltage level on the output signal line DOUT goes to a logic low level.

Figure 6:
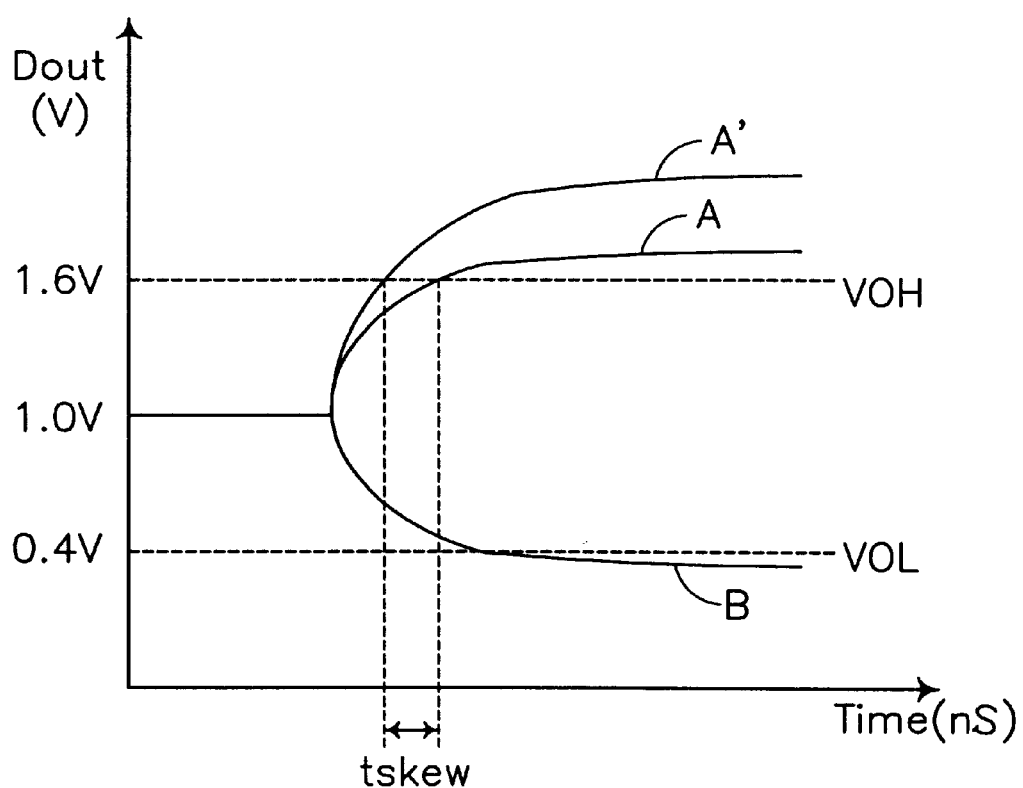
FIG. 6 is a graph of output voltage (DOUT) versus time which illustrates a change in timing skew associated with the data output buffer of FIG. 2 when increases in an external power supply voltage (EVC) are applied thereto and the internal power supply voltage (VINTQ) is held at a constant level.

If, however, a higher external power supply voltage HEVC beyond a normal external power supply voltage LEVC (e.g., about 2.5 volts) is supplied to the output buffer 160 while the first drive input DOK is provided with the predetermined boosted voltage (which is almost constant regardless of the external power supply voltage variation), then the current driving capability (or conductivity) of the pull-up transistor MN11 may increase significantly. As a result of this increase in conductivity of the pull-up transistor MN11, the parasitic skew between an output high voltage VOH and an output low voltage VOL on the output signal line DOUT may increase. In FIG. 6, reference symbols A and B represent the output high and low voltage waveforms when EVC is no greater than 2.5 Volts and the reference symbol A' represents the output high voltage waveform in a conventional circuit when EVC is greater than 2.5 Volts and no compensation of the internal power supply voltage is provided.

Figure 3:
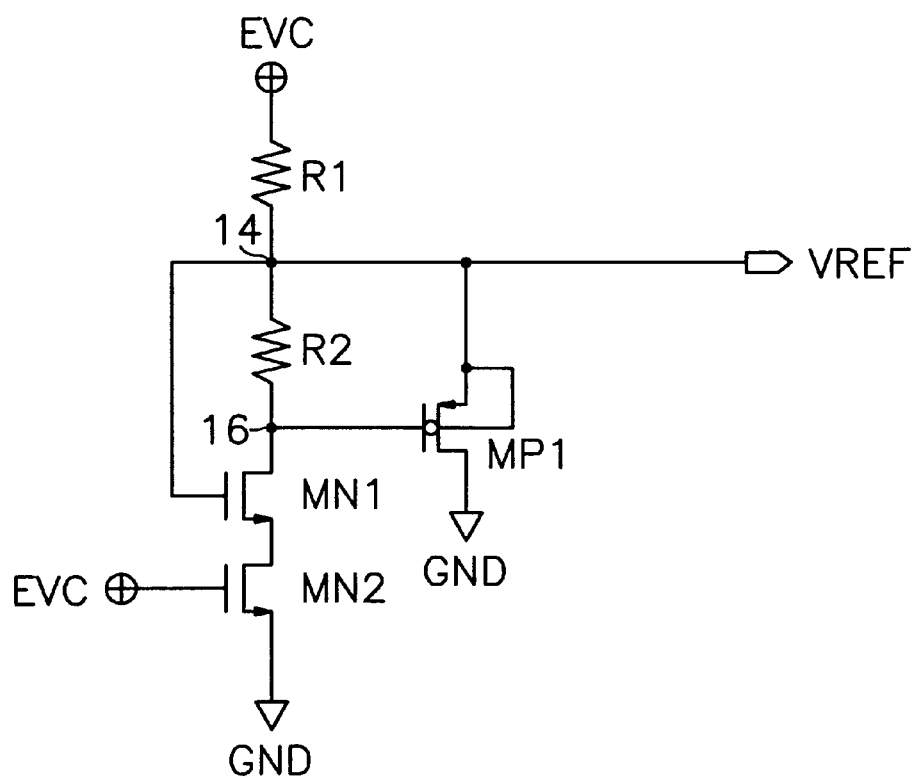
FIG. 3 is an electrical schematic of the first reference voltage generator of FIG. 1.

To inhibit timing skew ($t_{skew}$), a preferred internal power supply voltage generator circuit 200 is provided. In particular, FIG. 3 illustrates a detailed circuit construction of the first reference voltage generator 170 of FIG. 1. The first reference voltage generator 170 is comprised of resistors R1 and R2, NMOS transistors MN1 and MN2 and a PMOS transistor MP1. One end of the resistor R1 is electrically coupled to the external power supply voltage EVC and the other end thereof is electrically coupled to a first node 14 for providing a first reference voltage VREF (e.g., about 1.1 volts). One end of the resistor R2 is electrically coupled to the first node 14 and the other end thereof is electrically coupled to a second node 16. The NMOS transistors MN1 and MN2 have their source-drain conduction paths (i.e., channels) are electrically coupled in series between the second node 16 and the reference ground voltage GND. Gates of NMOS transistors MN1 and MN2 are electrically coupled to the first node 14 and the external power supply voltage EVC, respectively. The PMOS transistor MP1 has a source electrically coupled to the first node 14, a drain electrically coupled to the ground voltage GND, a gate electrode electrically coupled to the second node 16, and a body (or bulk) connection electrically coupled to the first node 14.

The first reference voltage VREF is equal to the sum of the threshold voltage $V_{TP1}$ of the PMOS transistor MP1 and the drain voltage $V_{DN1}$ of the NMOS transistor MN1 at node 16. The first reference voltage VREF is thus expressed as:

$$VREF = V_{TP1} + V_{DN1} \qquad (1)$$
$$= V_{TP1} + (V_{TP1}/R2)R_{TR}$$
$$= V_{TP1}(1 + R_{TR}/R2)$$

where $R_{TR}$ indicates the sum of the equivalent resistance of the NMOS transistors MN1 and MN2.

From equation 1, it is noted that the external power supply voltage EVC has little if any impact on the magnitude of the first reference voltage VREF. Moreover, the impact of any temperature variation on the first reference voltage is minimized since the threshold voltage $V_{TP1}$ is inversely proportional to temperature while the resistance sum $R_{TR}$ is proportional to temperature.

Figure 4:
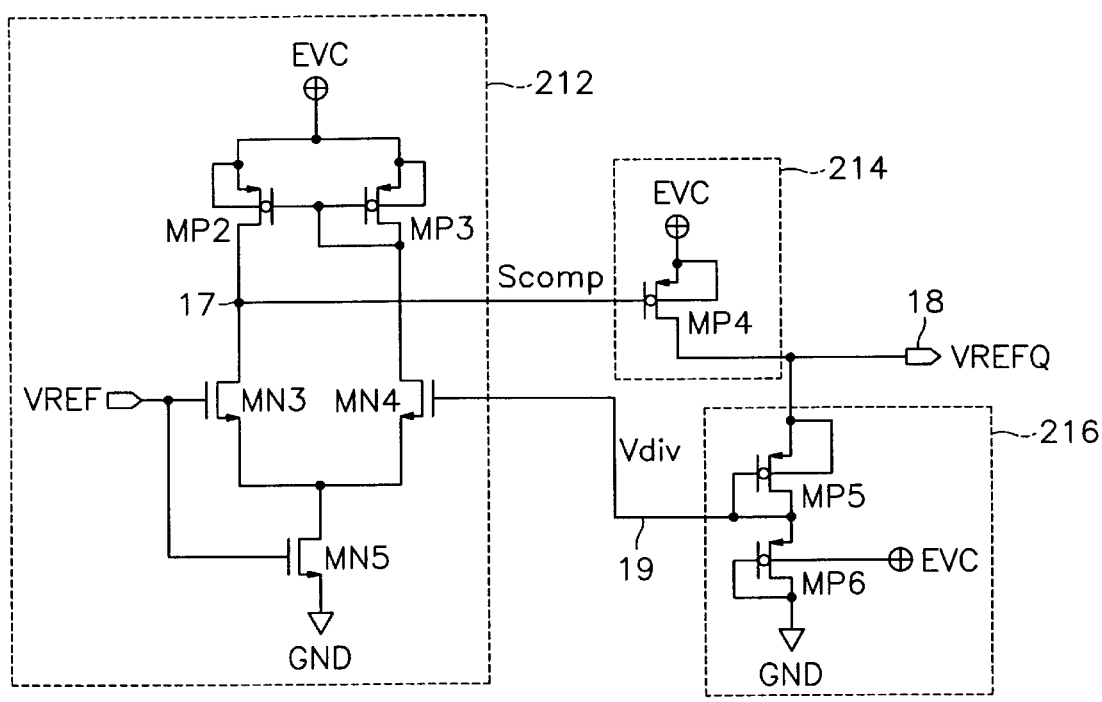
FIG. 4 is an electrical schematic of the second reference voltage generator of FIG. 1.

Referring now to FIG. 4, a detailed circuit construction of the second reference voltage generator 180 is illustrated. The second reference voltage generator 180 includes a differential amplifier 212, a pull-up driver 214, and a voltage divider 216. The differential amplifier 212 is comprised of a current mirror formed by PMOS transistors MP2 and MP3, an output node 17, a differential pair formed by NMOS transistors MN3 and MN4, and a current sink formed by NMOS transistor MN5. The current mirror transistors MP2 and MP3 are supplied with the external power supply voltage EVC. Bodies of the transistors MP2 and MP3 are also electrically coupled to the external power supply voltage EVC. The first reference voltage VREF is applied to gates of the transistors MN3 and MN5. The gate of the transistor MN4 is electrically coupled to the voltage divider 216. The output node 17 is electrically coupled to the pull-up driver 214. The differential amplifier 212 compares the first reference voltage VREF with a divided voltage Vdiv of the divider 216 and generates a comparison voltage Scomp at node 17. When the divided voltage Vdiv is lower than the first reference voltage VREF, the comparison voltage Scomp decreases so that the second reference voltage VREFQ increases. On the contrary, when the divided voltage Vdiv is higher than the first reference voltage VREF, the comparison voltage Scomp increases so that the second reference voltage VREFQ decreases. The pull-up driver 214 includes a PMOS transistor MP4 which has a gate electrically coupled to node 17. The source-drain channel of the transistor MP4 is electrically coupled between the external power supply voltage EVC and a node 18 for providing the second reference voltage VREFQ. The pull-up driver 214 drives the second reference voltage VREFQ by means of the external power supply voltage EVC. The voltage divider 216 is comprised of two PMOS transistor MP5 and MP6 electrically coupled in series as resistors between the node 18 and the ground voltage GND. The junction node 19 of the transistors MP5 and MP6 is electrically coupled to the gate of the transistor MN4 within the differential amplifier 212. The body of the transistor MP5 is electrically coupled to the node 18 while that of the transistor MP6 is electrically coupled to the external power supply voltage EVC. The voltage divider 216 divides the second reference voltage VREFQ into the voltage Vdiv. This voltage Vdiv is provided to the differential amplifier 212 via node 19.

Figure 7:
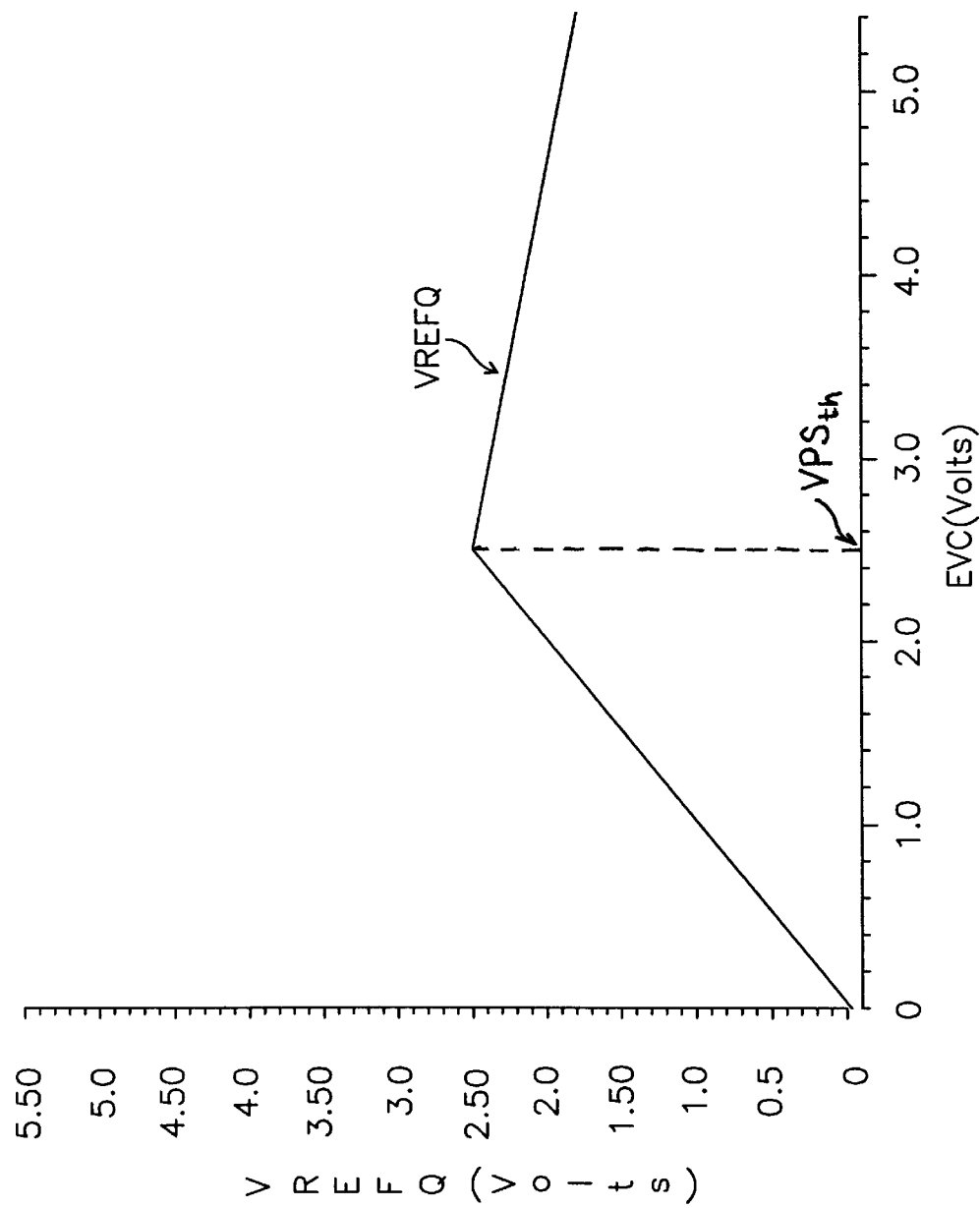
FIG. 7 is a graph of the second reference voltage (VREFQ), generated by the second reference voltage generator of FIG. 4, versus the external power supply voltage (EVC).

In the event a higher external power supply voltage EVC (e.g., beyond a threshold external power supply voltage $VPS_{th}$ of about 2.5 Volts) is supplied to the semiconductor memory chip of the invention, the threshold voltage $V_{TP6}$ of the PMOS transistor MP6 (within the divider circuit 216) increases, causing the divided voltage Vdiv to be increased. Consequently, when a external power supply voltage EVC in excess of $VPS_{th}$ is supplied to the memory device 100, the second reference voltage VREFQ decreases, as shown in FIG. 7, because the divided voltage Vdiv is relatively increased while the first reference voltage VREF remains constant (e.g. about 1.1 volts).

Figure 5:
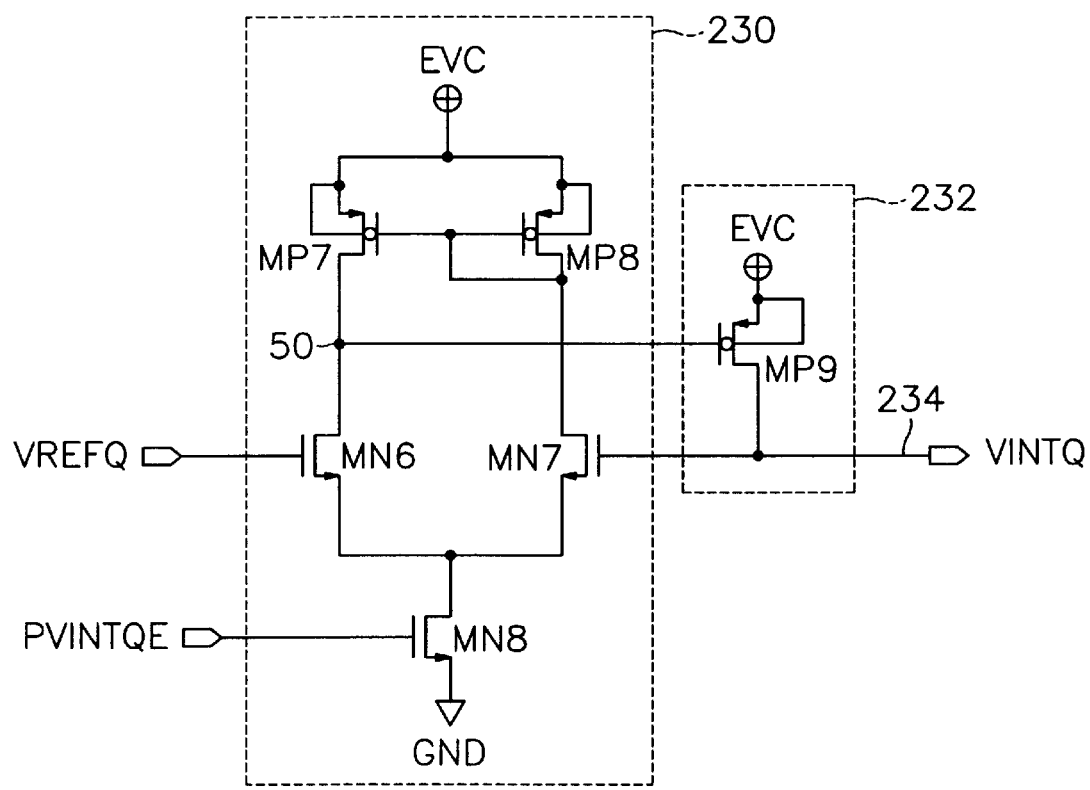
FIG. 5 is an electrical schematic of the output buffer power supply generator of FIG. 1.

FIG. 5 illustrates a detailed circuit schematic of the buffer power supply voltage generator 190. The buffer power supply voltage generator 190 includes a differential amplifier 230, a pull-up driver 232 and an output node 234 for providing the internal power supply voltage VINTQ to the data output buffer 160. The differential amplifier 230 is comprised of a current mirror formed by PMOS transistors MP7 and MP8, an output node 50 for providing a comparison voltage, a differential pair formed by NMOS transistors MN6 and MN7, and a current sink formed by NMOS transistor MN8. The current mirror transistors MP7 and MP8 are supplied with the external power supply voltage EVC. Bodies of the transistors MP7 and MP8 are electrically coupled to the external power supply voltage EVC. The second reference voltage VREFQ is applied to gate of the transistor MN6, and the internal power supply voltage VINTQ is fed back to the gate of the transistor MN7. The current sink transistor MN8 is responsive to a control signal PVINTQE from an internal control circuit (not shown). The pull-up driver 232 includes a PMOS transistor MP9 which has a gate electrically coupled to the node 50. The source-drain channel of the transistor MP9 is electrically coupled between the external power supply voltage EVC and the VINTQ signal line at node 234. The pull-up driver 232 drives the internal power supply voltage VINTQ by use of the external power supply voltage EVC.

When the internal power supply voltage VINTQ is lower than the second reference voltage VREFQ, the comparison voltage on the node 50 decreases so that the internal power supply voltage VINTQ increases.

On the contrary, when the internal power supply voltage VINTQ is higher than the second reference voltage VREFQ, the comparison voltage on the node 50 increases so that the internal power supply voltage VINTQ decreases. Accordingly, when a higher external power supply voltage EVC beyond a threshold external power supply voltage $VPS_{th}$ is supplied to the semiconductor memory device 100, the internal power supply voltage VINTQ decreases relatively since the second reference voltage VREFQ decreases (see FIG. 7). Referring now to FIG. 2, this decrease in VINTQ causes the gate-source voltage Vgs of the second pull-up transistor MN11 to be decreased as well. This decrease in gate-source voltage preferably compensates for the increase of the drain-source voltage Vds across MN11 caused by the high EVC. Accordingly, the transistor MN11 can be controlled to have a constant current driving capability regardless of the variations in the external power supply voltage EVC and so any skew between the output high voltage VOH and the output low voltage VOL due to the variation of the external power supply voltage EVC can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated buffer circuit, comprising:
   an output driver circuit electrically coupled to a first power supply line, a reference line and an output signal line;
   a voltage boosting circuit electrically coupled to a second power supply line and a first drive input of said output driver circuit, which drives the first drive input with a first driver signal; and
   means, electrically coupled to the first power supply line and responsive to a first power supply voltage thereon, for generating on the second power supply line a second power supply voltage which varies inversely with increases in the first power supply voltage.

2. The buffer circuit of claim 1, wherein said generating means comprises means for generating on the second power supply line a second power supply voltage which varies directly with increases in the first power supply voltage below a threshold power supply voltage, but varies inversely with increases in the second power supply voltage above the threshold power supply voltage.

3. The buffer circuit of claim 1, wherein said voltage boosting circuit comprises:
   a diode having an anode electrically connected to the second power supply line;
   a first pull-down transistor having a drain electrically connected to the first drive input and a source electrically connected to the reference line; and
   a first pull-up transistor having a drain electrically connected to the first drive input and a source electrically connected to a cathode of said diode.

4. The buffer circuit of claim 3, wherein said diode comprises a NMOS transistor having a drain and gate electrode electrically connected together.

5. The buffer circuit of claim 3, wherein said output driver circuit comprises:
   a second pull-up transistor having a gate electrode electrically connected to the first drive input, a drain electrically connected to the first power supply line and a source electrically connected to the output signal line; and
   a second pull-down transistor having a gate electrode electrically connected to a second drive input, a drain electrically connected to the output signal line and a source electrically connected to the reference line.

6. The buffer circuit of claim 5, wherein said second pull-up transistor and said second pull-down transistor comprise NMOS transistors.

7. The buffer circuit of claim 5, further comprising:
   a first NAND gate having a first input electrically connected to an input signal line and a second input electrically connected to a control signal line;
   a first inverter having an input electrically connected to the input signal line;
   a second NAND gate having a first input electrically connected to an output of said first inverter and a second input electrically connected to the control signal line; and
   a third inverter having an input electrically connected to an output of said second NAND gate and an output electrically connected to the second drive input.

8. The buffer circuit of claim 7, wherein said voltage boosting circuit further comprises:
   a second inverter having an input electrically connected to an output of said first NAND gate; and
   a capacitor having first and second electrodes electrically connected to an output of said second inverter and the cathode of said diode, respectively.

9. The buffer circuit of claim 8, wherein gate electrodes of said first pull-up and pull-down transistors are electrically connected to the output of said first NAND gate.

10. The buffer circuit of claim 8, further comprising a third NAND gate having a first input electrically connected to the input signal line and a second input electrically connected to the control signal line; wherein a gate electrode of said first pull-up transistor is electrically connected to the output of said first NAND gate; and wherein a gate electrode of said first pull-down transistor is electrically connected to the output of said third NAND gate.

11. The buffer circuit of claim 8, wherein said first pull-up transistor comprises a PMOS transistor and said first pull-down transistor comprises an NMOS transistor.

12. The buffer circuit of claim 1, wherein said generating means comprises:
   a first voltage generator which is electrically coupled to the first power supply line and generates a first reference voltage having a magnitude less than the first power supply voltage at an output thereof;
   a second voltage generator, electrically coupled to the output of said first voltage generator and the first power supply line, which generates a second reference voltage which varies inversely with increases in the first power supply voltage above a threshold power supply voltage; and
   a third voltage generator, electrically coupled to the output of said second voltage generator and the first power supply line, which generates the second power supply voltage at a level which varies directly with changes in the second reference voltage.

13. The buffer circuit of claim 12, wherein a magnitude of the first reference voltage is not influenced by changes in the first power supply voltage when the first power supply voltage is greater than the second power supply voltage.

14. The buffer circuit of claim 12, wherein said second voltage generator comprises:
   a first differential amplifier having a first input electrically connected to the output of said first voltage generator;
   a first pull-up driver having an input electrically coupled to an output of said first differential amplifier and an output electrically coupled to the output of said second voltage generator; and
   a voltage divider having an input electrically connected to the output of said second voltage generator and an output electrically coupled to a second input of said first differential amplifier.

15. The buffer circuit of claim 14, wherein said third voltage generator comprises:
   a second differential amplifier having a first input electrically connected to the output of said second voltage generator; and
   a second pull-up driver having an input electrically coupled to an output of said second differential amplifier.

16. The buffer circuit of claim 15, wherein an output of said second pull-up driver is electrically connected to a second input of said second differential amplifier and the second power supply line.

17. The buffer circuit of claim 8, wherein said generating means comprises:
   a first voltage generator which is electrically coupled to the first power supply line and generates a first reference voltage having a magnitude less than the first power supply voltage at an output thereof;
   a second voltage generator, electrically coupled to the output of said first voltage generator and the first power supply line, which generates a second reference voltage which varies inversely with increases in the first power supply voltage above a threshold power supply voltage; and
   a third voltage generator, electrically coupled to the output of said second voltage generator and the first power supply line, which generates the second power supply voltage at a level which varies directly with changes in the second reference voltage.

18. The buffer circuit of claim 17, wherein said second voltage generator comprises:
   a first differential amplifier having a first input electrically connected to the output of said first voltage generator;
   a first pull-up driver having an input electrically coupled to an output of said first differential amplifier and an output electrically coupled to the output of said second voltage generator; and
   a voltage divider having an input electrically connected to the output of said second voltage generator and an output electrically coupled to a second input of said first differential amplifier.

19. The buffer circuit of claim 18, wherein said third voltage generator comprises:
   a second differential amplifier having a first input electrically connected to the output of said second voltage generator; and
   a second pull-up driver having an input electrically coupled to an output of said second differential amplifier.

20. The buffer circuit of claim 19, wherein an output of said second pull-up driver is electrically connected to a second input of said second differential amplifier and the second power supply line.

21. An integrated buffer circuit, comprising:
   an output driver powered at a first power supply voltage;
   a voltage boosting circuit which drives an input of said output driver and is powered at a second power supply voltage having a magnitude less than a magnitude of the first power supply voltage; and
   an internal power supply voltage generator which generates the second power supply voltage at a level which varies inversely with increases in the first power supply voltage.

22. The buffer circuit of claim 21, wherein said internal power supply voltage generator generates the second power supply voltage at a level which varies directly with increases in the first power supply voltage below a threshold power supply voltage, but varies inversely with increases in the second power supply voltage above the threshold power supply voltage.

23. An integrated circuit memory device, comprising:
   a memory cell array;
   an input/output gate electrically coupled to said memory cell array; and
   a buffer circuit electrically coupled to the input/output gate, said buffer circuit comprising:
      an output driver powered at a first power supply voltage;
      a voltage boosting circuit which drives an input of said output driver and is powered at a second power supply voltage having a magnitude less than a magnitude of the first power supply voltage; and
      an internal power supply voltage generator which generates the second power supply voltage at a level which varies inversely with increases in the first power supply voltage.

24. The memory device of claim 23, wherein said internal power supply voltage generator generates the second power supply voltage at a level which varies directly with increases in the first power supply voltage below a threshold power supply voltage, but varies inversely with increases in the second power supply voltage above the threshold power supply voltage.

* * * * *